United States Patent [19]

Vatis

[11] Patent Number: 4,677,382

[45] Date of Patent: Jun. 30, 1987

[54] APPARATUS FOR PROVIDING MULTIPLE-SPECIES CAPABILITY OF SINGLE-SPECIES NMR SPECTROMETRY/IMAGING APPARATUS

[75] Inventor: Dimitrios Vatis, Schenectady, N.Y.

[73] Assignee: General Electric Company, Schenectady, N.Y.

[21] Appl. No.: 767,211

[22] Filed: Aug. 19, 1985

[51] Int. Cl.[4] .......................................... G01R 33/20
[52] U.S. Cl. ................................... 324/307; 324/314
[58] Field of Search ............... 324/300, 307, 310, 313, 324/314, 79 R, 79 D

[56] References Cited

U.S. PATENT DOCUMENTS 4,329,646  5/1982  Tsuda .................................. 324/314
4,471,305  9/1984  Crooks et al. ....................... 324/314

Primary Examiner—Michael J. Tokar

Attorney, Agent, or Firm—Geoffrey H. Krauss; James C. Davis, Jr.; Marvin Snyder

[57] ABSTRACT

Conversion apparatus facilitating acquisition of NMR spectroscopy and/or imaging information from a desired one of a plurality of nuclear species, in a system originally capable of acquiring spectroscopy/imaging information for only a single nuclear species, uses: a first frequency converter to provide an excitation signal by heterodyning the transmitter signal of the single species system to the Larmor frequency of the desired one of the plurality of nuclear species, if that desired species is not the original single species; and a second frequency converter to heterodyne the response signal from the Larmor frequency of the desired nuclear species, if that desired species is not the original single species, to the frequency of the single species. The first and second converters are bypassed if the single original species is the desired species.

20 Claims, 3 Drawing Figures

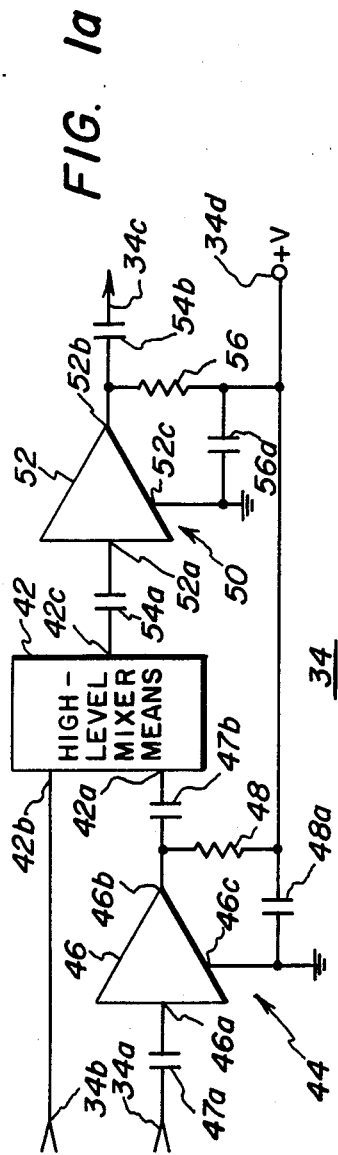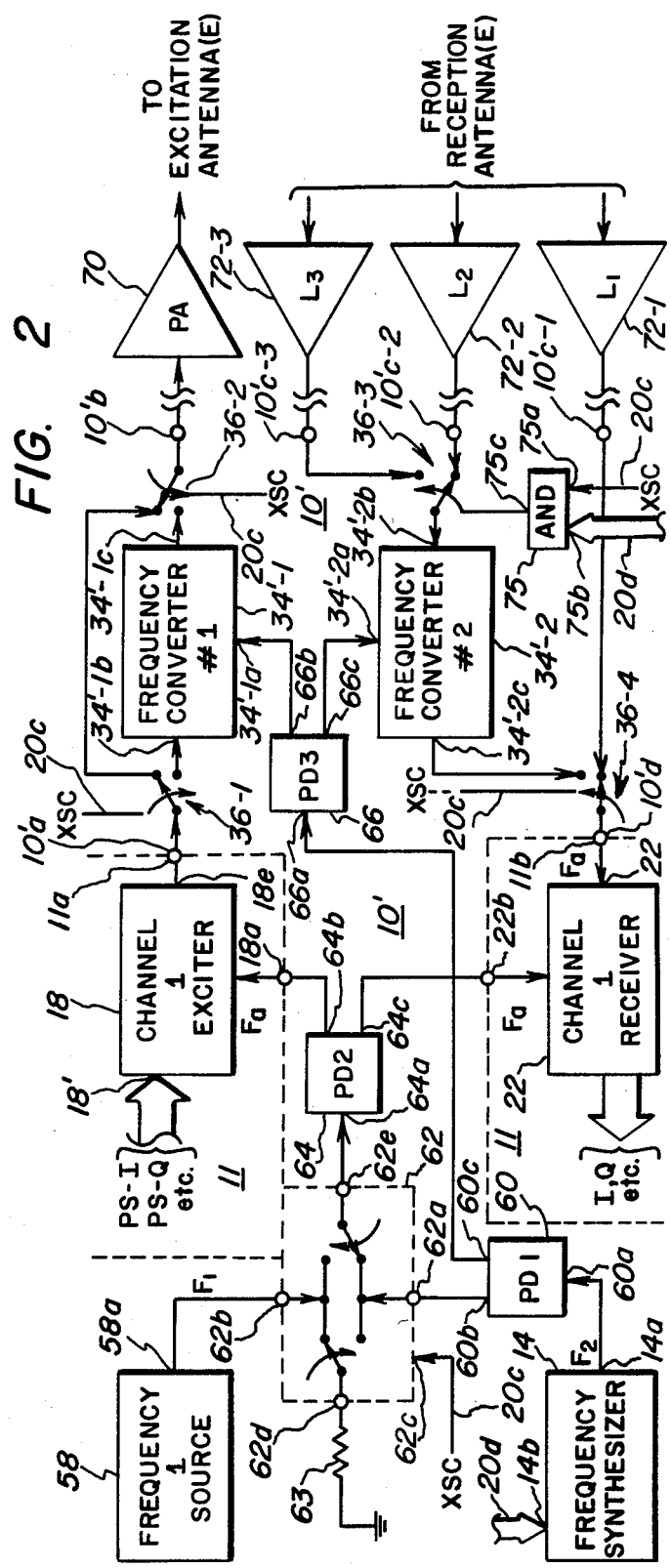

APPARATUS FOR PROVIDING MULTIPLE-SPECIES CAPABILITY OF SINGLE-SPECIES NMR SPECTROMETRY/IMAGING APPARATUS

BACKGROUND OF THE INVENTION

The present application relates to NMR spectroscopy and imaging and, more particularly, to novel apparatus for converting single-species nuclear magnetic resonance (NMR) spectrometry/imaging apparatus into multi-species spectrometry apparatus.

The potential for use of NMR spectroscopy for in vivo medical diagnosis of human patients is well known. At present, the vast majority of NMR spectroscopic imagers operate with a single nuclear species, e.g. hydrogen, or $^1H$, nuclei. In a typical high-amplitude static magnetic field system, such as described and claimed in co-pending U.S. patent application Ser. No. 743,125, filed June 10, 1985, assigned to the assignee of the present application and incorporated herein in its entirety by reference, a super-conducting magnet with a static main magnetic field of about 1.5 Tesla (T) is utilized. As is well known, the resonance frequency F of the nuclear species (e.g. $^1H$) to be investigated is given by the Larmor formula: $F = \gamma B_O$, where $B_O$ is the magnitude of the main static magnetic field (in Tesla) and $\gamma$ is the gyromagnetic ratio for the particular nucleus species. For a main static field $B_O$ of 1.5 T and $\gamma_{1H}$ of about 42.58 MHz/T, the resonance frequency F is about 63.87 MHz. It is advantageous to acquire NMR spectroscopic image information by irradiating the sample, to be investigated, with an excitation signal having a pair of signal portions in phase-quadrature with one another, and to provide a received response signal, from the sample, separated into a pair of phase-quadrature components. It is therefore highly desirable to utilize Zero-Intermediate-Frequency (ZIF) techniques to generate the in-phase (I) signal and the quadrature-phase (Q) signal in both the transmitting and receiving portions of the NMR spectrometer. The use of such ZIF techniques requires that at least one 90° phase-shift-network (PSN) be utilized for quadrature-modulation in the excitation transmitter and that another 90° PSN be used in quadrature-detection apparatus in the response signal receiver. It is not prohibitively difficult (and is, in fact, rather easy) to design a 90° PSN to operate with a desired low magnitude of both phase and amplitude unbalance errors over a relatively narrow bandwidth centered about the single Larmor resonance frequency for a single-species spectroscopic imager. However, it is prohibitively difficult to provide the same extremely low phase and amplitude unbalance error magnitudes in a practical NMR spectrometer for imaging more than one of the nuclei species involved with living organisms. For example, in addition to $^1H$ hydrogen nuclei, it may be desirable to compare spectra from $^{13}C$ carbon (having a gyromagnetic ratio $\gamma$ of about 10.71 MHz/T, and a resonance frequency F of about 16.065 MHz. in the aforementioned 1.5 T system) and/or $^{31}P$ phosphorous (having a gyromagnetic ratio $\gamma$ of about 17.23 MHz./T, and a resonance frequency F of about 25.845 MHz. in the same 1.5 T system). Investigations requiring images of the respective abundance of these three nucleus species will thus require phase-shift networks operating over a two octave bandwidth (i.e. a 4:1 frequency span) with the required low magnitude of phase and amplitude unbalance errors; such phase shift networks are presently impractical. It has been suggested to utilize a different set of phase-shift networks, each optimized for an assigned nuclear species resonance frequency, and select and switch the proper network into the excitation signal transmitter and into the response signal receiver, as the need arises; this solution has not only proven to be relatively costly, but also not particularly useful in the highly-automated spectroscopic imaging environment which should be provided in spectroscopy apparatus for use by life science professionals. Accordingly, apparatus for enabling a single-species NMR spectroscopic imager to operate at the resonance frequencies of a plurality of different nucleus species is highly desirable.

SUMMARY OF THE INVENTION

In accordance with the invention, conversion apparatus for acquiring NMR spectroscopy and/or imaging information from a desired one of a plurality of nuclear species, with a system originally capable of acquiring NMR spectroscopy and/or imaging information for only a single nuclear species, comprises: first means for frequency converting the excitation signal, provided by the transmitter of the single species system, to the Larmor frequency of the desired one of the plurality of nuclear species, if that desired species is not the single species; second means for frequency converting the response signal from the Larmor frequency of the desired nuclear species, if that desired species is not the single species, to the frequency of the single species; and means for bypassing both of said first and second means if said single species is the desired species.

In presently preferred embodiments, the single species is that one of the totality of species having the highest Larmor frequency; the Larmor frequencies of all other species are heterodyned (in an upward, i.e. increased frequency, direction for response signal reception, and in a downward, i.e. decreased frequency, direction for excitation signal transmission) with relatively simple filtering being used to remove undesired image signals and the like. One of a pair of variable-frequency synthesizers can be replaced with at least one fixed single frequency high-stability oscillator, in one embodiment, to reduce the cost of the conversion apparatus.

Accordingly, it is an object of the present invention to provide novel apparatus for providing acquisition of multiple nuclear species spectroscopy data with a nuclear magnetic resonance spectroscopy system originally having the capability to acquire NMR spectroscopic and/or imaging information for only a single nuclear species.

This and other objects of the present invention will become apparent upon reading the following detailed description, when considered in conjunction with the drawings.

BRIEF DESCRIPTION OF THE DRAWINGS

FIG. 1a is a schematic diagram of a presently preferred embodiment for one form of frequency conversion means; and FIG. 2 is a schematic block diagram of another presently preferred embodiment of multi-species conversion apparatus for use with a single-species NMR spectroscopic imager.

DETAILED DESCRIPTION OF THE INVENTION

Figure 1:
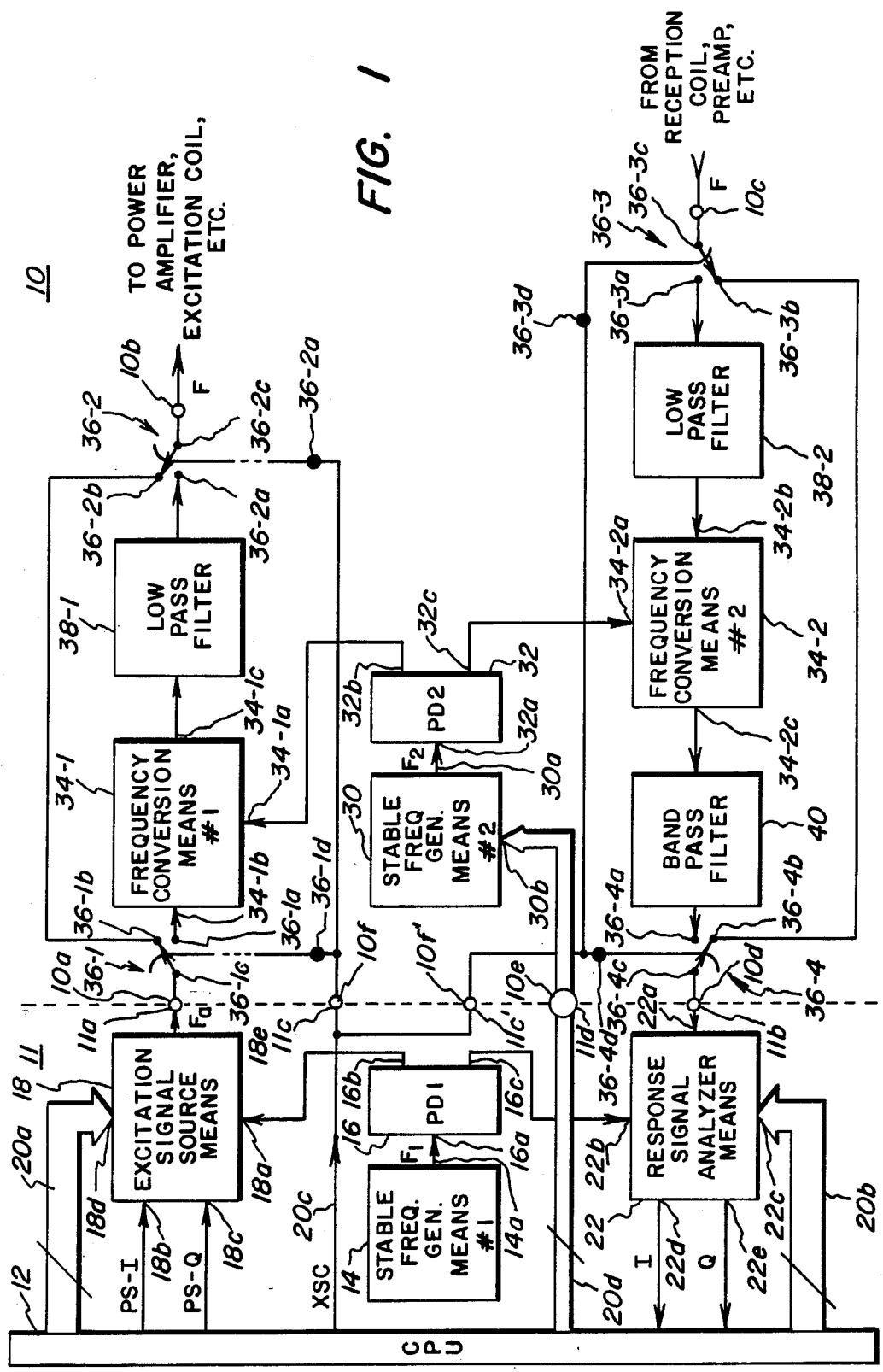
FIG. 1 is a schematic block diagram of a first presently preferred configuration of apparatus for converting a single-species spectroscopic imager into a multi-species NMR spectroscopic imager.

Referring initially to FIG. 1, one presently preferred embodiment of conversion apparatus 10, for adapting a single-nuclear-species NMR spectroscopic imager means 11 for use at the resonance frequencies of a plurality of different nuclear species, is shown. Conversion apparatus 10 and single-species spectrometer means 11 are utilized with the spectrometer imaging system computer sub-system and particularly with the central processing unit (CPU) 12 thereof. In the single-species spectrometer 11, a single stable frequency generator means 14 provides a radio-frequency (RF) signal of output frequency $F_1$, which is adjusted to be at the Larmor frequency of the single nuclear species to be investigated. This frequency-$F_1$ RF carrier signal is provided to an input 16a of a first power divider PD1 means 16, providing first and second portions of the single-frequency-$F_1$ signal at power divider means first and second outputs 16b and 16c, respectively. The portion of the frequency-$F_1$ signal at output 16b is provided to a carrier signal input 18a of an excitation signal source means 18. Means 18 also receives the in-phase and quadrature-phase portions of a pulse shaping pair of signals PS-1 and PS-Q, respectively, at respective inputs 18b and 18c. A plurality of digital control (gating, etc.) signals are provided to a digital signal input port 18d of the source means, via a portion 20a of a system control bus, from the CPU means 12. Responsive to these analog and digital signals, the amplitude, phase and other characteristics of an excitation output signal, at source means output 18e, are determined. The excitation signal is provided to the spectrometer excitation output 11a, and will typically, in the single-species spectroscopic imaging system, be provided to a subsequent power amplifier, excitation antennae (coil or the like) and similar means, which are not shown, but which are all as well known to the art. The nuclei to be investigated are stimulated by the excitation signal and, responsive thereto, provide a response signal which is received by a reception antennae, preamplified and subsequently applied to the reception input 11b of the single-species spectrometer means 11. The receive signal is then applied to the RF input 22a of a response signal analyzer means 22, which also receives the remaining sample of the frequency-$F_1$ carrier signal at a second, or local oscillator, signal input 22b. Responsive to the two RF signals and to at least one digital control signal provided to the response signal analyzer means control input port 22c (from a digital control bus portion 20b originating at CPU means 12), the response signal analyzer means provides an in-phase data signal I and a quadrature-phase data signal Q, respectively, at respective outputs 22d and 22e, to CPU means 12 for appropriate processing in accordance with methods well known to the art.

The single-species spectroscopic/imaging system is either initially configured or subsequently modified to provide a digital species selection control XSC line 20c to at least one spectrometer output, e.g. the pair of outputs 11c and 11c', and to also provide a multi-byte system data bus extension portion 20d to a digital bus output port 11d. The XSC signal on bus portion 20c is in a first logic condition at all times when the original single nuclear species is to be operated upon in the sample under investigation, and is in a second opposite signal state, opposite to the first signal state, when any additional nuclear species (i.e. other than the original species) is to be investigated in the sample.

In accordance with one aspect of the invention, the conversion apparatus 10 includes a second stable frequency generating means 30 having an output 30a at which a second frequency-$F_2$ RF carrier signal is provided. The second stable frequency generator means output signal frequency $F_2$ is capable of variation over some frequency range, under control of the digital data provided at a frequency control input port 30b from data bus portion 20d. Means 30 is advantageously a digitally-controlled frequency synthesizer, as is means 14. The second frequency-$F_2$ signal is applied to the input 32a of a second power divider PD2 means 32. First and second portions of this second frequency signal are provided at first and second respective outputs 32b and 32c, respectively. Second power divider first output 32b provides a local oscillator (LO) signal to a first input 34-1a of a first frequency conversion means 34-1. Second power divider second output 32c provides a LO signal to the first input 34-2a of a second frequency conversion means 34-2. A second input 34-1b of first frequency conversion means 34-1 is connected to a first selectable port 34-1a of a first switching means 36-1. In this first presently preferred conversion apparatus embodiment 10, four poles of switching means 36 are required, which can comprise four separate single-pole, double-throw switching means 36-1 through 36-4, or a pair of double-pole, double-throw switching means comprised of switching means portions 36-1 and 36-2 or 36-3 and 36-4, respectively. Each switching means 36 can be any appropriate means for routing RF signals between a common port and each of a pair of selectable output ports, responsive to a binary electrical signal at a control input 36d. Thus, a first switching means 36-1 has its second selectable port 36-1b shown as the port normally-connected to the input, or common, port 36-1c; this connection would normally exist in response to a low, or substantially zero, voltage condition on the XSC bus portion 20c; the XSC signal is made available, through the coupling of output 11c and control input 10f, to a control input 36-1d of the first switching means 36-1. The control input 36-2d of a second switching means 36-2 is also connected to conversion apparatus control input 10f, so that both of switching means 36-1 and 36-2 operate in conjunction with one another (and could be replaced with a first one of the aforementioned double-pole, double-throw switching means). The normally-connected output port 36-1b of first switching means 36-1 is connected to second selectable port 36-2b of the second switching means which is normally connected to the switching means common port 36-2c and then to a conversion apparatus excitation signal output 10b. The first selectable port 36-2a of switching means 36-2 is connected to the output of a low pass filter 38-1 which receives the signal at the output 34-1c of the first frequency conversion means.

The response signal, from the reception antennae, preamplifier and the like means (not shown), is now provided to the reception signal input 10c of the conversion apparatus, for connection to the common port 36-3c of a third switching means 36-3. There is a normally closed connection between common port 36-3c and a second selectable port 36-3b. Common port 36-3c is connected to the normally-closed second selectable port 36-4b of a fourth switching means 36-4. The common port 36-4c of the latter switching means is connected to a converting means reception signal output 10d, for connection to the reception signal input 11b of the single-species spectrometer. The first selectable port 36-3a of the third switching means is coupled, through a second low pass filter means 38-2, to a second input 34-2b of the second frequency conversion means 34-2. The second frequency conversion means output 34-2c is coupled through a bandpass filter 40 to the remaining selectable port 36-4a of the fourth switching means. The control inputs 36-3d and 36-4d of the switching means on the reception side are connected in parallel to the second control input 10f', connected through control output 11c' to the XSC portion 20c of the data bus. (Thus, the second double-pole, double-throw switching means can replace switching means 36-3 and 36-4.)

In operation, apparatus 10 receives the spectrometer excitation signal, which has the required amplitude, phase and/or other characteristics thereof established at the single-species resonance frequency, e.g. about 63.9 MHz. for $^1H$, at input 10a, and carries out a super-heterodyning down-conversion thereof. Since this output signal is to contain the difference between the excitation signal source means frequency $F_a$ and the second stable frequency generator means output frequency $F_2$ (which may be less than or greater than the excitation signal frequency $F_a$), the required final frequency, e.g. $F=16.1$ MHz. for $^{13}C$ and $F=25.8$ MHz. for $^{31}P$, can be obtained with respective lower or higher second frequencies $F_2$ of $F_2=47.8$ MHz. and $F_2=38.1$ MHz., or $F_2=80.0$ MHz. and $F_2=89.7$ MHz. The selection of the lower or higher second frequency may, it should be understood, be effected by considerations such as the frequency range of the second generator means 30, the phase transfer characteristics of the apparatus 10, and alike. By lowpass filtering of the conversion means output signal in filter means 38-1, only the difference frequency is substantially allowed to appear in the first frequency conversion means output signal. It will be seen that the cutoff frequency and, in fact, the entire attenuations vs. frequency characteristic of lowpass filter 38-1 must be selected based upon whether the second frequency $F_2$ is above or below excitation frequency $F_a$. Advantageously, low pass filter 38-1 will have an attenuation characteristic of elliptical form, having attenuation peaks selected to occur at at least one of the excitation or second frequencies for at least one of the additional nuclear species for which spectroscopy capability is provided by conversion apparatus 10. The down-frequency-converted and lowpass-filtered signal is, responsive to a high, or logic one, signal condition present on the XSC bus portion 20c, provided at conversion apparatus output 10b. The signal at output 10b is subsequently power amplified and used for irradiation of the sample to be investigated. It will be seen that, at the normal single-species frequency $F_a$, the XSC signal on bus portion 20c is at the low logic level condition, so that the signal at input 10a is routed through switching means ports 36-1c, 36-1b, 36-2b and 36-2c, directly to conversion apparatus output 10b, without encountering frequency conversion means 34-1 or filter means 38-1.

The response signal received from the sample to be investigated is preamplified and provided to conversion apparatus reception input 10c. At the normal single-species frequency, where $F=F_a$, the XSC signal is at the low logic condition, whereby switching means port 36-3c is connected to port 36-3b and then through port 36-4b to port 36-4c, so that the preamplified signal is provided to the response signal analyzer means input 22a. At any one of the adapter multi-species input frequencies, the XSC line signal is at a logic high condition, whereby the response signal entering the conversion apparatus input 10c is applied through switching means 36-3 to lowpass filter 38-2. Advantageously, the second low pass filter 38-2 has substantially the same transmission-attenuation characteristics as the first low pass filter 38-1. The lowpass-filtered, preamplified signal is then applied to the RF second input 34-2b of the second frequency conversion means 34-2. The received signal is heterodyned with the second frequency $F_2$ signal portion at the second conversion means first input 34-2a, and the resulting summation product, appearing at second frequency conversion means output 34-2c, is filtered by bandpass filter means 40 and appears as a signal at the single-species frequency $F_a$ at the conversion apparatus output 10d, for introduction into the $F_a$ response signal and analyzer means 22. Thus, a response signal received at either the single-species frequency $F_a$, or at a different multiple-species frequency F, is always analyzed by means 22 as a $F_a$ frequency signal, so that the proper in-phase I video (or "baseband") signal is provided at analyzer means first output 22d to the CPU, and the proper quadrature-phase Q video (or "baseband") signal is provided at the signal analyzer second output 22e to the CPU, for analysis and display.

Frequency conversion means 34 must have a highly linear transfer characteristic, to preserve the amplitude variations of the excitation signal RF pulses. To provide the large dynamic range necessary for that high degree of linearity, each frequency conversion means 34 utilizes a high level mixer 42, such as a Mini-Circuits Labs SRA-1H and the like. The first, or local oscillator, input 34a of the frequency conversion means may require amplification, by a first amplifier means 44, before application to the local oscillator input 42a of the high-level mixer means. Because typical high-level mixers require LO input levels between about +15 dBm. and about +30 dBm., a first amplifier means 44 with at least 10 dB. of gain is often required. To provide the +17 dBm. LO level required by the afore-mentioned type SRA-1H mixer, with a +3 dBm. signal level at input 34a, first amplifier means 44 provides 14 dB. RF gain, by utilization of a hybrid amplifier 46, such as the type MWA-130 amplifier available from Motorola Semiconductor Corp. The amplifier input 46a is coupled to the conversion means input 34a through a DC blocking capacitor 47a, while amplifier output 46b is coupled to mixer input 42a through another DC blocking capacitor 47b. For the particular amplifier 46 utilized, a positive operating potential +V (provided to the frequency conversion means operating power input 34d), with respect to amplifier common potential terminal 46c, is coupled through an amplifier load resistance 48 directly to amplifier output 46b. Advantageously, a RF bypass capacitance 48a is connected between the supply end of load resistance 48 and circuit common potential. The signal to be converted is provided to second signal input 34b, for connection to the second input 42b of the mixer means. The sum and difference products are provided at mixer means output 42c, and may be amplified in a second amplifier means 50 before being provided at frequency conversion means output 34c. Second amplifier means 50 comprises a second hybrid amplifier 52, having its input 52a connected to the mixer means output 42c through a first DC blocking capacitor 54a, having its output 52b connected to the conversion means output 34c through another DC blocking means 54b. A load resistance 56 also allows application of the positive operating potential, at input 34d, to amplifier output 52b; a RF bypass capacitance 56a may be connected between the supply end of resistance 56 and the second amplifier common potential terminal 52c.

Referring now to FIG. 2, an alternative presently preferred conversion apparatus 10' embodiment, which utilizes a fixed-frequency stable oscillator 58 for providing the single-species resonance frequency $F_1$ at the output 58a thereof, is shown. In this embodiment only a single frequency synthesizer 14 is now required, rather than the two synthesizers 14 and 30 generally required for embodiment 10. Thus, the relatively high cost of the second synthesizer means 30 is not required for the add-on conversion apparatus 10'. As in the first embodiment, the original single-species spectrometer 11 includes the single-species frequency $F_1$, or "channel 1", excitation means 18 and single-species frequency $F_a$, or channel 1, response signal reception analyzer/receiver means 22. It will be seen that the system CPU means 12 and some of the analog and digital signal lines, shown in FIG. 1, are not specifically shown in FIG. 2, although it will understood that the species selection control XSC bus portion 20c and the digital frequency-establishment bus portion 20d are present at all assemblies requiring these signal bus portions. Digital bus portion 20d is coupled to a control port 14b of the frequency synthesizer 14, to control the frequency $F_2$ of the signal at the single synthesizer output 14a. The second frequency $F_2$ signal is coupled to the input 60a of a first power divider PD1 means 60. A first portion of the divided power is provided at a first power divider first output 60b, for coupling to an additional switching means 62 first input 62a. The first frequency $F_1$ output signal at source output 58a is coupled to a second input 62b of this additional switching means. The additional switching means 26 effectively contains a double-pole, double-throw switch, such that, responsive to the normal-species, logic-low condition XSC signal at the additional switching means control input 62c, the second input 62b is connected to a first output 62d (as shown). The first output 62d is terminated in an element 63 having a termination impedance substantially equal to the characteristic impedance of the RF cables utilized. The frequency synthesizer output $F_2$ signal at input 62a is simultaneously coupled (as shown) to a second output 62e such that PD1 output 60b is connected to the input 64a of a second power divider (PD2) means 64. Accordingly, a first portion of the $F_2$ frequency output from the synthesizer appears at second power divider output 64b, for coupling to the RF input 18a of the exciter means, while another portion appears at second power divider second output 64c for coupling to the local oscillator input 22b of the receiver means. Responsive to the $F_2$ frequency input at port 18a, and the proper pulse-amplitude shaping and gating signals at the remaining ports (now shown as lumped into a single port 18'), the single-species excitation signal is provided at exciter output 18e for coupling, through the joined terminals 11a and 10'a, to first switch means 36-1 of conversion apparatus 10'.

First power divider second output 60c provides a frequency-$F_2$ signal at the input 66a of a third power divider (PD3) means 66. Portions of the frequency-$F_2$ signal input to the third power divider appear at the first output 66b and the second output 66c thereof for introduction into respective first frequency converter means first input 34-1a and second frequency converter means first input 34'-2a. A first frequency converter means second input 34'-1b is connected to the normally-open selectable port of a first RF switching means 36-1, while the first frequency converter means output 34'-1c is connected to the normally-open selectable RF port of a second switching means 36-2. The normally-closed selectable RF ports of the first and second switching means 36-1 and 36-2, respectively, are connected together to normally couple the conversion apparatus transmission channel input 10'a to the transmission channel output 10'b; the transmission output 10'b is then further coupled through a power amplifier PA means 70 to the at least one excitation antenna of the NMR system. The foregoing excitation channel arrangement is predicated upon the use of a single power amplifier 70, capable of spanning the entire resonance frequency range of the various nuclear species; suitable multi-octave high-peak-power amplifiers are currently available. However, suitable low-noise reception preamplifiers currently available provide optimum operating characteristics over a relatively narrow frequency range; accordingly, a separate one of preamplifiers 72 is utilized for amplifying each different species response signal, from at least one reception antenna (not shown), at the associated one of the resonance frequencies of an associated one of the plurality of nucleus species to be utilized. Thus, a first low-noise-figure preamplifier $L_1$ means 72-1 is utilized for the $^1H$ resonance signal illustratively at about 63.9 MHz.), while a second low-noise-figure preamplifier $L_2$ means 72-2 is utilized for $^{13}C$ carbon spectral signals at the resonance frequency of about 16.1 MHz., and a third low-noise-figure preamplifier $L_3$ means 72-3 is optimized for the $^{31}P$ phosphorous resonance frequency of about 25.9 MHz., in the illustrated 1.5 T imaging system. The normal single-species preamplifier 72-1 is connected to the single-species reception input 10'c-1 of the conversion apparatus, for connection to the normally-connected selectable RF port of the reception channel output switching device 36-4. When the normal single-species spectrometer is to be utilized, with a low logic level on the XSC line 20c, the output of single-species preamplifier means 72-1 is connected through switching means 36-4 to the conversion apparatus reception channel output 10'd and then through the spectrometer input 11b to the channel 1 receiver input 22a, for normal useage at the associated single-species frequency thereof. The third switching device 36-3 is now connected to switch the outputs of the various additional-species associated preamplifiers 72-2, 72-3, . . . (as respectively coupled to additional-species conversion apparatus reception inputs 10'c-2, 10'c-3, . . . ) to the second input 34'-2b of the second frequency converter means 34'-2. The second frequency converter means output 34'-2c is now connected to the normally-open selectable RF port of fourth switching device 36-4.

In operation, conversion apparatus 10' operates in a original-single-species mode when the XSC signal on bus portion 20c is in a logic low condition, and operates in an additional-nuclear-species mode when the XSC signal is in a logic high condition. Responsive to the XSC logic low signal condition at its control input 62c, additional switching means 62 is configured (as shown), to connect the substantially constant frequency first source output 58a, at input 62b, to a termination 63, at output 62d, and to connect a portion of the frequency synthesizer output, at first power divider output 60b and input 62a, to output 62e and the input 64a of the second power divider. Frequency synthesizer 14 is set, via the digital control signals on bus portion 20d and at synthesizer control input port 14b, with its frequency F₂ substantially equal to the single-species original frequency $F_a$. Thus, the original-single-species resonance frequency $F_a$ is provided as the frequency of the signals at the exciter input 18a and the receiver local oscillator input 22b. The low logic state of the XSC signal causes the conversion apparatus first and second switching means 36-1 and 36-2 to connect the conversion apparatus excitation input 10'a to the excitation output 10'b, such that the original-single-species excitation signal, (with frequency $F_a$) is applied to the input of power amplifier 70 and the amplified signal is then applied to the excitation antennae. The response signal, from the reception antennae, is applied to preamplifier 72-1, and appears at conversion apparatus reception input terminal 10'c-1. Also responsive to the low logic condition of the XSC signal, the fourth switching means 36-4 connects input 10'c-1 to the conversion apparatus reception signal output 10'd, for connection to the original channel $F_a$ receiver input 22a. Thus, it will be seen that for a low logic condition on the XSC bus, indicative of an original single-species investigation, switching means 36-1, 36-2 and 36-4, plus additional switching means 62, configures the apparatus for investigation at that original single-species frequency.

For a logic one, or high, condition of the XSC signal, switching means 36-1 and 36-2 are operated to connect conversion means transmission input 10'a to the input 34'-1b of the first frequency converter means and to connect the output 34'1c thereof to the conversion apparatus excitation output 10'b. Simultaneously, switching means 36-4 is operated to connect the output 34'-2c of the second frequency conversion means to the conversion apparatus reception output 10'd. The XSC signal is also applied to one input 75a of a log AND circuit 75, which receives the nuclear-species request lines of digital data bus portion 20d at a second input 75b. The logic AND circuit output 75c operates third switching means 36-3 to cause the second nuclear-species input 10'c-2 to be connected to the second frequency converter means input 34'-2b whenever both the XSC signal is at a high logic condition and the second species selection line of portion 20d is also at a logic condition selecting the second species for investigation by the instrument. Similarly, when both a third-species select signal is provided to AND circuit input 75b and the XSC signal at input 75a is in a logic one condition, the AND circuit output 75c operates switching means 36-3 to connect the third species input 10'c-3 to the second frequency converter means input 34'-2b. The signal at input 34-2b is heterodyned against the local oscillator signal at input 34'-2a, to provide an intermediate-frequency $F_a$ signal at output 34'-2c. This signal, having been up converted to the single-species resonance frequency $F_a$, is received and analyzed as though it were the single-species response signal normally expected at the channel one receiver input 22a. As the frequency F₂ of the frequency synthesizer output 14a signal is controlled by the digital data provided at frequency-control input 14b, and can be changed responsive to the activation of the second-species, third-species, . . . select lines which are part of bus portion 20d, the conversion frequency at second converter means input 34'-2a is changed at the same time that the different nuclear species preamplifier 72 is connected to the second frequency converter means input 34'-2b, to automatically provide reception of the response signal from that nuclear species excited by the appropriate species excitation signal automatically provided at the conversion apparatus transmission output 10'b.

While several presently preferred embodiments of my novel apparatus, for converting single-species NMR systems to multi-species NMR systems, have been described with detail herein, many variations and modifications will now become apparent to those skilled in the art. It is my intent, therefore, to be limited only by the scope of the appending claims and not by the specific details and instrumentalities presented herein by way of explanation of the presently preferred embodiments of my invention.

What is claimed is:

1. Conversion apparatus, used with a nuclear magnetic resonance (NMR) system having a transmitter and a receiver originally capable of acquiring response signals from only a single nuclear species, for acquiring response signals from a desired one of a plurality of nuclear species including the original single species, comprising:

first means for frequency converting an excitation signal, provided by said original system transmitter, to another excitation signal having substantially the resonance frequency of the desired one of the plurality of nuclear species, if that desired species is not the original single species;

second means for frequency converting a response signal from the resonance frequency of the desired nuclear species, if that desired species is not the original single species, to a signal, at said receiver, have a frequency substantially equal to the original single species resonance frequency; and means for bypassing both of said first and second means if said original single species is the desired species.

2. The apparatus of claim 1, wherein said original single species is selected to be that one of said plurality of nuclear species having the highest gyromagnetic constant.

3. The apparatus of claim 2, wherein said original single species is ¹Hydrogen.

4. The apparatus of claim 3, wherein at least one additional one of said plurality of nuclear species is ¹³Carbon.

5. The apparatus of claim 4, wherein said plurality of nuclear species also includes ³¹Phosphorous.

6. The apparatus of claim 3, wherein at least one additional one of said plurality of nuclear species is ³¹Phosphorous.

7. The system of claim 3, wherein said original single species resonance frequency is on the order of 64 MHz.

8. The apparatus of claim 2, wherein said plurality of nuclear species have resonance frequencies over about 2 octaves.

9. The apparatus of claim 1, further comprising: stable oscillator means, separate from said first means, for providing a local oscillator frequency signal for heterodyning said original single species excitation signal substantially to the resonance frequency of said desired species.

10. The apparatus of claim 9, wherein said first means comprises: first mixer means for heterodyning said local oscillator signal and said excitation signal to provide an output signal substantially at the resonance frequence of said desired species; and first filtering means, receiving the output signal from said first mixer means, for substantially passing the output signal component substantially at the selected species resonance frequency, while simultaneously substantially attenuating the components of said output signal at the frequencies of at least said local oscillator signal and said original single species excitation signal.

11. The apparatus of claim 10, wherein said first mixer means subtracts the frequency of one of said local oscillator and excitation signals from the frequency of the other.

12. The apparatus of claim 9, wherein said stable oscillator means is also separate from said second means and provides a local oscillator frequency signal for heterodyning said desired original single species response signal substantially to the resonance frequency of said original species.

13. The apparatus of claim 12, wherein said second means comprises: second mixer means for heterodying said local oscillator signal and said response signal to provide an output signal substantially at said original single species resonance frequency; and second filtering means, receiving the signal from the output of said second mixer means, for substantially passing the output signal component substantially at the original single species response frequency and for substantially attenuating the components of said output signal at the frequencies of at least said local oscillator signal and said desired species response signal.

14. The apparatus of claim 13, wherein said second mixer means adds the frequencies of said local oscillator and excitation signals to obtain the output signal frequency.

15. The apparatus of claim 13, wherein said original single species has a gyromagnetic constant greater than the gyromagnetic constant of all other species, and said second means further comprises: lowpass filtering means for substantially attenuating in the response signal to be provided to said second mixer means, any response signal component substantially at the original single species resonance frequency component.

16. The apparatus of claim 12, wherein said oscillator means is a variable-frequency signal synthesizer.

17. The apparatus of claim 1, further comprising: stable oscillator means, separate from said second means, for providing a local oscillator frequency signal for heterodyning said desired original single species response signal substantially to the resonance frequency of said original species.

18. The apparatus of claim 17, wherein said second means comprises: second mixer means for heterodyning said local oscillator signal and said response signal to provide an output signal substantially at said original single species resonance frequency; and second filtering means, receiving the signal from the output of said second mixer means, for substantially passing the output signal component substantially at the original single species response frequency and for substantially attenuating the components of said output signal at the frequencies of at least said local oscillator signal and said desired species response signal.

19. The apparatus of claim 18, wherein said second mixer means adds the frequencies of said local oscillator and excitation signals to obtain the frequency of said output signal.

20. The apparatus of claim 18, wherein said original single species has a gyromagnetic constant greater than the gyromagnetic constant of all other species, and said second means further comprises: lowpass filtering means for substantially attenuating in the response signal to be provided to said second mixer means, any response signal component substantially at the original single species resonance frequency component.

* * * * *